(12) United States Patent
Mistretta et al.

(10) Patent No.: US 7,408,347 B2
(45) Date of Patent: Aug. 5, 2008

(54) HIGHLY CONSTRAINED MAGNETIC RESONANCE SPECTROSCOPY IMAGE RECONSTRUCTION METHOD

(75) Inventors: Charles A. Mistretta, Madison, WI (US); Scott Reeder, Middleton, WI (US); John Perry, Madison, WI (US); Oliver Wieben, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 40 days.

(21) Appl. No.: 11/524,838

(22) Filed: Sep. 21, 2006

(65) Prior Publication Data

US 2007/0167729 A1    Jul. 19, 2007

Related U.S. Application Data

(60) Provisional application No. 60/719,429, filed on Sep. 22, 2005, provisional application No. 60/783,962, filed on Mar. 20, 2006.

(51) Int. Cl.
*G01V 3/00* (2006.01)

(52) U.S. Cl. ...................................... 324/307

(58) Field of Classification Search ......... 324/300–322; 600/410–435
See application file for complete search history.

(56) References Cited

U.S. PATENT DOCUMENTS

| | | | |
|---|---|---|---|
| 5,502,385 A | 3/1996 | Kuhn et al. | |
| 5,603,322 A | 2/1997 | Jesmanowicz et al. | |
| 5,604,778 A | 2/1997 | Polacin et al. | |
| 5,933,006 A | 8/1999 | Rasche et al. | |
| 6,490,472 B1 | 12/2002 | Li et al. | |
| 6,807,248 B2 | 10/2004 | Mihara et al. | |
| 6,954,067 B2 | 10/2005 | Mistretta | |
| 2001/0027262 A1 | 10/2001 | Mistretta et al. | |
| 2007/0010731 A1* | 1/2007 | Mistretta | 600/407 |
| 2007/0038073 A1* | 2/2007 | Mistretta | 600/410 |
| 2007/0156044 A1* | 7/2007 | Mistretta et al. | 600/410 |
| 2007/0156045 A1* | 7/2007 | Mistretta et al. | 600/410 |
| 2007/0167728 A1* | 7/2007 | Mistretta et al. | 600/410 |

FOREIGN PATENT DOCUMENTS

EP    0 627 633 A1    7/1994

(Continued)

OTHER PUBLICATIONS

Wieslaw L. Nowinski, The Iterated Normalized Backprojection Method of Image Reconstruction, Institute of Computer Science, Polish Academy of Science Ordona 21, 01-237 Warsaw, Poland.

(Continued)

*Primary Examiner*—Diego Gutierrez
*Assistant Examiner*—Dixomara Vargas
(74) *Attorney, Agent, or Firm*—Quarles & Brady LLP (57) ABSTRACT

A series of image frames are acquired in which an MR parameter such as echo time (TE) is changed and the resulting image frames are employed to produce an MRS image of a metabolite. Scan time is reduced without sacrificing image quality by reconstructing a composite image from data acquired for a plurality of the image frames and using a highly constrained image reconstruction method with the composite image to produce each image frame.

11 Claims, 9 Drawing Sheets

FOREIGN PATENT DOCUMENTS

| WO | WO 2005/026765 | 3/2005 |
|---|---|---|
| WO | WO 2005/069031 | 7/2005 |

OTHER PUBLICATIONS

Y. Huang et al, Time-Resolved 3D MR Angiography by Interleaved Biplane Projection, Proc. Intl. Soc. Mag. Reson. Med. 13 (2005).

T.A. Cashen et al, Comparison of Temporal and Spatial Undersampling Techniques for Time-Resolved Contrast-Enhanced MR Angiography, Proc. Intl. Soc. Mag. Reson. Med. 13, (2005).

Graeme C. McKinnon et al, Towards Imaging the Beating Heart Usefully with a Conventional CT Scanner, Trans. on Biomedical Eng., vol. BME-28, No. 2, p. 123-127, Feb. 1981.

Kathryn L. Garden et al, 3-D Reconstruction of the Heart from few Projections: A Practical Implementation of the McKinnon-Bates Algorithm, Trans. on Biomedical Eng., vol. MI-5, No. 4, p. 233-234, Dec. 1986.

A.L. Wentland et al, Technique for Acquiring MR Images of CSF Flow During a Valsalva Maneuver, Med. Phys. Univ. of WI, Madison WI.

K.M. Johnson et al, Average and Time-Resolved Dual Velocity Encoded Phase Contrast Vastly Undersampled Isotropic Projection Imaging, Med. Phys. Univ. of WI, Madison WI.

K.M. Johnson et al, Transtenotic Pressure Gradient Measurements Using Phase Contrast Vastly Undersampled Isotropic Projection Imaging (PC-VIPR) in a Canin Model, Med. Phys. Univ. of WI, Madison WI.

C.A. Mistretta et al, Highly Constrained Backprojection for Time-Resolved MRI, Mag. Reson. Med. 55:30-40 (2006).

Zhi-Pei Liang et al, Constrained Reconstruction Methods in MR Imaging, Reviews of Mag. Reson. in Med. vol. 4, pp. 67-185, 1992.

J.G. Pipe et al, Spiral Projection Imaging: a new fast 3D trajectory, Proc. Intl. Soc. Mag. Reson. Med. 13, (2005).

K.V. Koladia et al, Rapid 3D PC-MRA using Spiral Projection Imaging, Proc. Intl. Soc. Mag. Reson. Med. 13, (2005).

J. Tsao et al, k-t Blast and k-t Sense: Dynamic MRI With High Frame Rate Exploiting Spatiotemporal Correlations, Mag. Reson. Med. 50:1031-1042 (2003).

Zhi-Pei Liang et al, Constrained Imaging-Overcoming the Limitations of the Fourier Series, IEEE Engineering in Medicine and Biology, Sep./Oct. 1996, pp. 126-132.

Zhi-Pei Liang et al, Fast Algorithm for GS-Model-Based Image Reconstruction in Data-Sharing Fourier Imaging, IEEE Transactions on Med. Imaging, vol. 22, No. 8, pp. 1026-1030, Aug. 2003.

Klass P. Pruessmann et al, Advances in Sensitivity Encoding With Arbitrary k-Space Trajectories, Mag. Reson. in Med. 46:638-651 (2001).

R. Fahrig et al, Use of a C-Arm System to Generate True Three-dimensional Computed Rotational Angiograms: Preliminary In Vitro and In Vivo Results, AJNR: 18, pp. 1507-1514,Sep. 1997.

A.V. Barger, et al, Single Breath-Hold 3D Contrast-Enhanced Method for Assessment of Cardiac Function, Mag. Reson. in Med. 44:821-824 (2000).

J. Du et al, Time-Resolved Undersampled Projection Reconstruction Imaging for High-Resolution CE-MRA of the Distal Runoff Vessels, Mag. Reson. in Med. 48:516-522 (2002).

Ashwani Aggarwal et al, Imaging in Turbid Media by Modified Filtered Back Projection Method Using Data From Monte Carlo Simulation, Proc. of SPIE vol. 5047, pp. 314-324.

Xavier Golay, et al, Presto-Sense: An Ultrafast Whole-Brain fMRI Technique, Mag. Reson. in Med. 43:779-786 (2000).

Ronald R. Price, et al, Practical Aspects of Functional MRI (NMR Task Group #6), Medical Physics, vol. 29, No. 8, pp. 1892-1912, Aug. 2002.

M.S. Hansen et al., k-t Blast Reconstruction From Arbitrary k-t space Sampling: Application To Dynamic Radial Imaging, Proc. Intl. Soc. Mag. Reson. Med. 13 p. 684 (2005).

* cited by examiner

HIGHLY CONSTRAINED MAGNETIC RESONANCE SPECTROSCOPY IMAGE RECONSTRUCTION METHOD

CROSS-REFERENCE TO RELATED APPLICATIONS

This application is based on U.S. Provisional Patent Application Ser. Nos. 60/719,429 filed on Sep. 22, 2005 and entitled "HIGHLY CONSTRAINED MAGNETIC RESONANCE SPECTROSCOPY IMAGE RECONSTRUCTION METHOD"; and 60/783,962 filed on Mar. 20, 2006 and entitled "HIGHLY CONSTRAINED MAGNETIC RESONANCE SPECTROSCOPY IMAGE RECONSTRUCTION METHOD".

STATEMENT REGARDING FEDERALLY SPONSORED RESEARCH

This invention was made with government support under Grant No. 1R01HL72260-01 awarded by the National Institute of Health. The United States Government has certain rights in this invention.

BACKGROUND OF THE INVENTION

The field of the invention is magnetic resonance spectroscopy.

Magnetic resonance spectroscopy (MRS) uses the nuclear magnetic resonance (NMR) phenomenon to produce spectra of tissue components. When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form a spectrum of a particular substance.

Magnetic Resonance Spectroscopy (MRS) may be used in vivo for the determination of individual chemical compounds located within a volume of interest. The underlying principle of MRS is that atomic nuclei are surrounded by a cloud of electrons which slightly shield the nucleus from any external magnetic field. As the structure of the electron cloud is specific to an individual molecule or compound, the magnitude of this screening effect is then also a characteristic of the chemical environment of individual nuclei. Since the resonant frequency of the nuclei is proportional to the magnetic field it experiences, the resonant frequency can be determined not only by the external applied field, but also by the small field shift generated by the electron cloud. Detection of this chemical shift, which is usually expressed as "parts per million" (PPM) of the main frequency, requires high levels of homogeneity of the main magnetic field $B_0$.

Typically, MR proton spectroscopy is used to generate a one-dimensional (1D) frequency spectrum representing the presence of certain chemical bonds in the region of interest. In medical diagnosis and treatment, MRS provides a non-invasive means of identifying and quantifying metabolites from a region of interest, often the human brain. By finding the relative spectral amplitudes resulting from frequency components of different molecules, medical professionals can identify chemical species and metabolites indicative of diseases, disorders, and other pathologies such as Alzheimer's disease, cancer, stroke, and the like. In this context, two nuclei are typically of particular interest, $^1H$ and $^{31}P$. Phosphorus 31 MRS is directed to the detection of compounds involved in energy metabolism relating to membrane synthesis and degradation. Metabolites of particular interest in proton MRS studies include glutamate (Glu), glutainine (Gln), choline (Cho), creatine (Cre), N-acetylaspartate (NAA), and the inositols (ml and sl). With new contrast agents such as hyperpolarized C13, metabolic processes can be observed in the human body, e.g. in the context of cancer detection, by analyzing the signal contributions from various metabolites in regions of interest. Also, much work has been done in cardiac energetics using $^{31}P$ spectroscopy.

When utilizing these signals to produce spectral images, magnetic field gradients ($G_x$, $G_y$, and $G_z$) are employed. Typically, the region to be imaged is scanned by a sequence of measurement cycles in which these gradients vary according to the particular localization method being used. Each measurement is referred to in the art as a "view" and the number of views determines the resolution and quality of the image. The resulting set of received NMR signals, or views, or k-space samples, are digitized and processed to reconstruct the image using one of many well known reconstruction techniques. The total scan time is determined in part by the number of measurement cycles, or views, that are acquired for an image, and therefore, scan time can be reduced at the expense of image resolution and quality by reducing the number of acquired views.

The most prevalent method for acquiring an NMR data set from which an image can be reconstructed is referred to as the "Fourier transform" imaging technique or "spin-warp" technique. This technique is discussed in an article entitled "Spin-Warp NMR Imaging and Applications to Human Whole-Body Imaging", by W. A. Edelstein et al., *Physics in Medicine and Biology*, Vol. 25, p. 751-756 (1980). It employs a variable amplitude phase encoding magnetic field gradient pulse prior to the acquisition of NMR signals to phase encode spatial information in the direction of this gradient. In a two-dimensional implementation (2DFT), for example, spatial information is encoded in one direction by applying a phase encoding gradient ($G_y$) along that direction, and then a signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($G_{y_i}$) in the sequence of views that are acquired during the scan. In a three-dimensional implementation (3DFT) a third gradient ($G_z$) is applied before each signal readout to phase encode along the third axis. The magnitude of this second phase encoding gradient pulse $G_z$ is also stepped through values during the scan. These 2DFT and 3DFT methods sample k-space in a rectilinear pattern.

Figure 2:
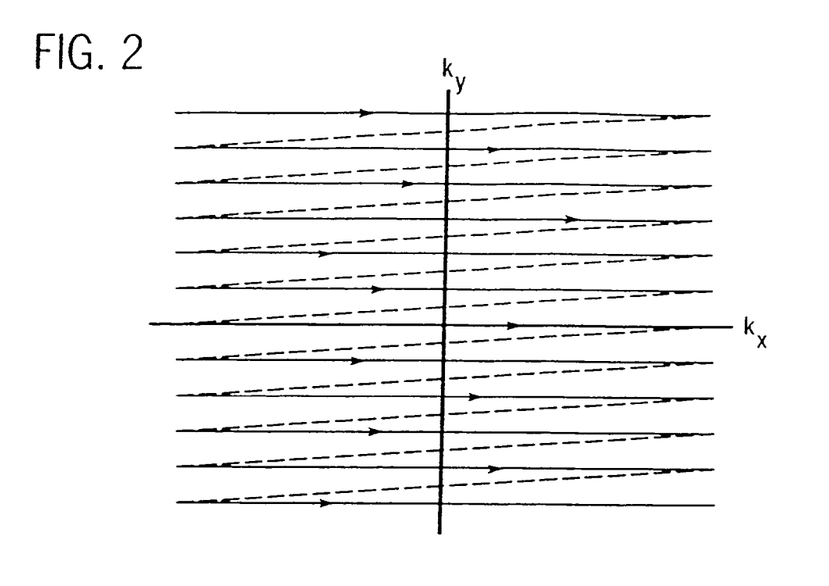
FIG. 2 is a graphic illustration of the manner in which k-space is sampled during a typical Fourier, or spin-warp, image acquisition using the MRI system of FIG. 1.
Figure 3:
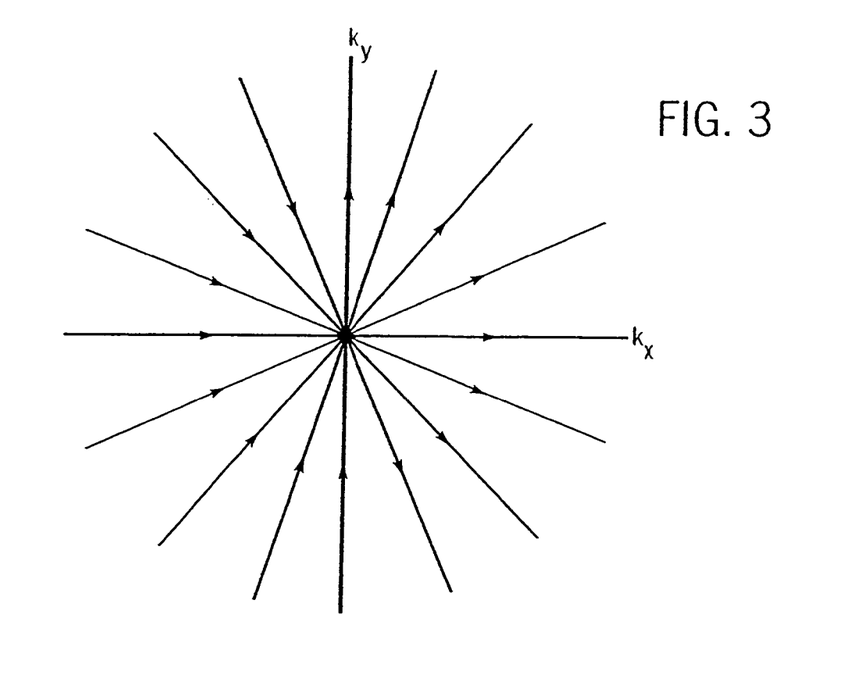
FIG. 3 is a graphic illustration of the manner in which k-space is sampled during a typical projection reconstruction image acquisition using the MRI system of FIG. 1.

There has also been recent work using projection reconstruction methods for acquiring time-resolved MRA data as disclosed in U.S. Pat. No. 6,487,435. Projection reconstruction methods have been known since the inception of magnetic resonance imaging. Rather than sampling k-space in a rectilinear scan pattern as is done in Fourier imaging and shown in FIG. 2, projection reconstruction methods sample k-space with a series of views that sample radial lines extending outward from the center of k-space as shown in FIG. 3. The number of such radial projection views needed to sample k-space determines the length of the scan and if an insufficient number of views are acquired, streak artifacts are produced in the reconstructed image. The technique disclosed in U.S. Pat. No. 6,487,435 reduces such streaking by acquiring successive undersampled images with interleaved projection views and sharing peripheral k-space data between successive images.

There are two methods used to reconstruct images from an acquired set of k-space radial projection views as described, for example, in U.S. Pat. No. 6,710,686. The most common method is to regrid the radial k-space samples from their locations on the radial sampling trajectories to a Cartesian grid. The image is then reconstructed by performing a conventional 2D or 3D Fourier transformation of the regridded k-space samples. The second method for reconstructing an image is to transform the radial k-space projection views to Radon space by Fourier transforming each radial projection view. An image is reconstructed from these signal projections by filtering and backprojecting them into the field of view (FOV) as is commonly done with x-ray CT projections. As is well known in the art, if the acquired signal projections are insufficient in number to satisfy the Nyquist sampling theorem, streak artifacts are produced in the reconstructed image.

Figure 4:
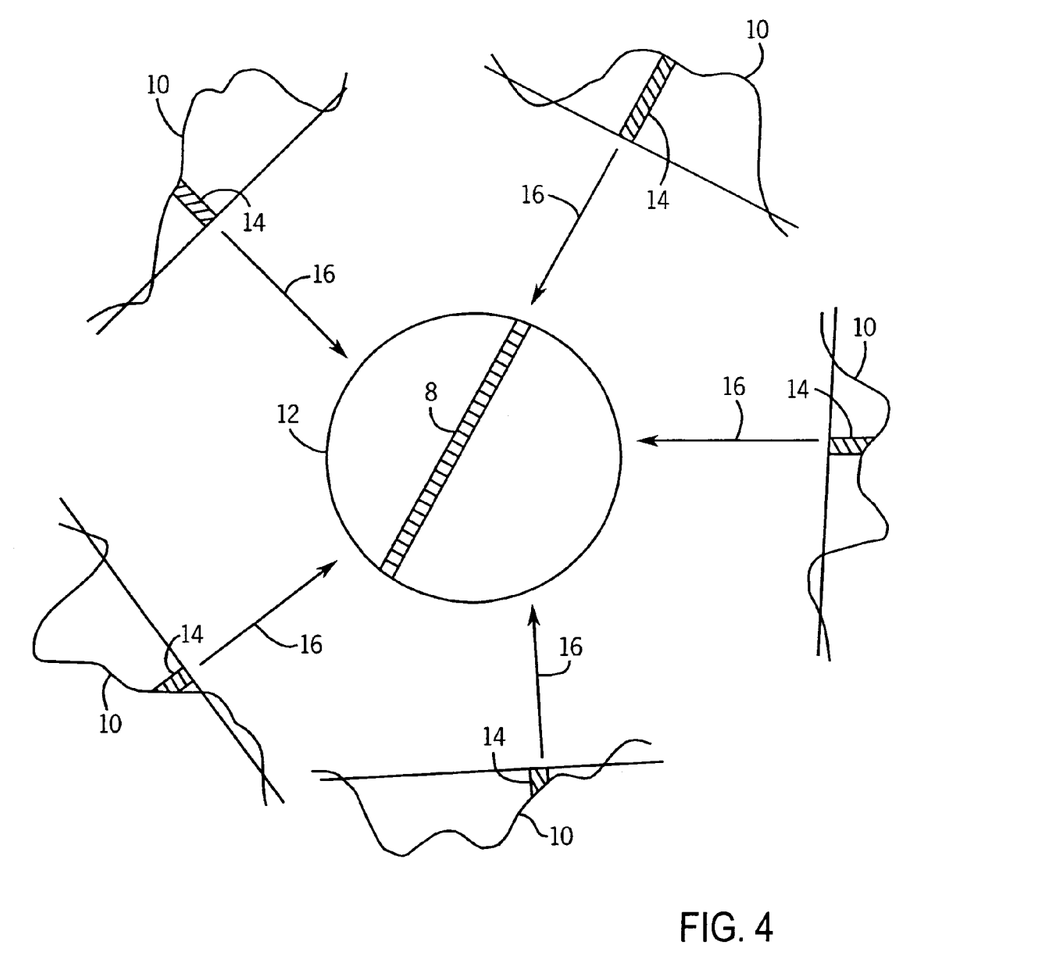
FIG. 4 is a pictorial representation of a conventional back-projection step in an image reconstruction process.

The standard backprojection method is shown in FIG. 4. Each acquired signal projection profile 10 is backprojected onto the field of view 12 by projecting each signal sample 14 in the profile 10 through the FOV 12 along the projection path as indicted by arrows 16. In projecting each signal sample 14 in the FOV 12 we have a no a priori knowledge of the subject and the assumption is made that the NMR signals in the FOV 12 are homogeneous and that the signal sample 14 should be distributed equally in each 2D or 3D pixel through which the projection path passes. For example, a projection path 8 is illustrated in FIG. 4 for a single signal sample 14 in one signal projection profile 10 as it passes through N pixels in the FOV 12. The signal value (P) of this signal sample 14 is divided up equally between these N pixels:

$$S_n = (P \times 1)/N \quad (1)$$

where: $S_n$ is the NMR signal value distributed to the $n^{th}$ pixel in a backprojection path having N pixels.

Clearly, the assumption that the NMR signal in the FOV 12 is homogeneous is not correct. However, as is well known in the art, if certain corrections are made to each signal profile 10 and a sufficient number of profiles are acquired at a corresponding number of different projection angles, the errors caused by this faulty assumption are minimized and image artifacts are suppressed. In a typical, filtered backprojection method of image reconstruction, 400 projections are typically required for a 256×256 pixel 2D image and 203,000 projections are required for a 256×256×256 voxel 3D image. If the method described in the above-cited U.S. Pat. No. 6,487,435 is employed, the number of projection views needed for these same images can be reduced to 100 (2D) and 2000 (3D).

SUMMARY OF THE INVENTION

The present invention is a method for producing an MR image of a subject in which a plurality of sets of projection views are acquired using a pulse sequence and an MR parameter in the pulse sequence is changed for each set. The acquired projection views are interleaved and a composite image is reconstructed using more than one set of acquired projection views. A highly constrained backprojection reconstruction of the image frames is then performed using the composite image and each set of acquired projection views. The highly constrained image reconstruction includes weighting the backprojection of each acquired projection view with corresponding pixel values in the composite image.

A general object of the invention is to improve the quality of image frames acquired with different MR parameters. By using the larger number of acquired interleaved projection views to reconstruct the composite image, its quality is higher than image frames reconstructed only from each set of projection views. Constraining the reconstruction of each image frame using the higher quality composite image conveys that higher quality to each image frame.

Another object is to improve the reconstruction of an MRS image. The spectra of metabolites in tissue can be produced by acquiring a series of MR image frames in which an MR parameter such as echo time (TE) is changed through a range of values as successive MR image frames are acquired. By using the highly constrained image reconstruction method, the quality of these images can be significantly improved for a given acquisition time and the resulting MRS image produced from the image frames is substantially improved.

Figure 5:
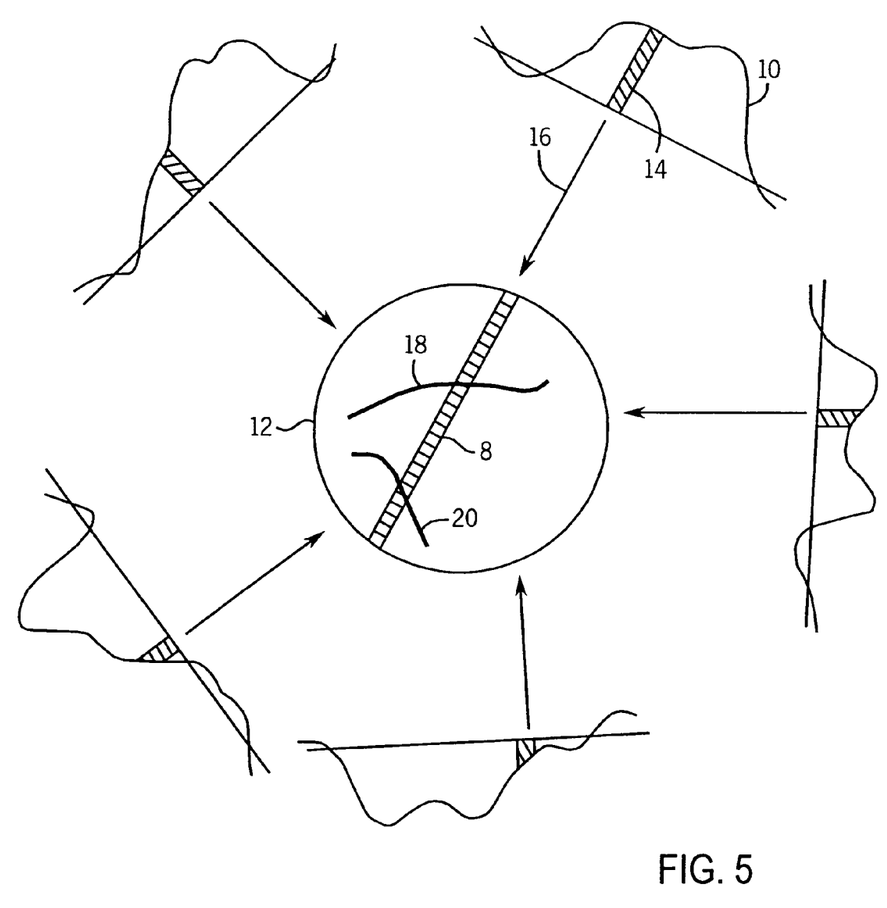
FIG. 5 is a pictorial representation of the same step as implemented according to the highly constrained backprojection method that forms part of the present invention.

A discovery of the present invention is that good quality MR spectroscopy images can be produced with far fewer projection signal profiles if a priori knowledge of the NMR signal contour in the FOV 12 is used in the backprojection process instead of the assumed homogeneous signal contour. Referring to FIG. 5, for example, the signal contour in the FOV 12 may be known to include structures such as blood vessels 18 and 20. That being the case, when the backprojection path 8 passes through these structures a more accurate distribution of the signal sample 14 in each pixel is achieved by weighting the distribution as a function of the known NMR signal contour at that pixel location. As a result, a majority of the signal sample 14 will be distributed in the example of FIG. 5 at the pixels that intersect the structures 18 and 20. For a backprojection path 8 having N pixels this may be expressed as follows:

$$S_n = (P \times C_n) \bigg/ \sum_{n=1}^{N} C_n \quad (2)$$

where P=the NMR signal sample value; and
$C_n$=signal value of an a priori composite image at the $n^{th}$ pixel (or voxel) along the backprojection path.

The numerator in equation (2) weights each pixel using the corresponding NMR signal value in the composite image and the denominator normalizes the value so that all backprojected signal samples reflect the projection sums for the time frame and are not multiplied by the sum of the composite image. It should be noted that while the normalization can be performed on each pixel separately after the backprojection is performed, in many clinical applications it is far easier to normalize the projection P before the backprojection. In this case, the projection P is normalized by dividing by the corresponding value $P_c$ in a projection through the composite image at the same view angle. The normalized projections $P/P_c$ are then backprojected and the resulting image is then multiplied by the composite image.

Figure 6:
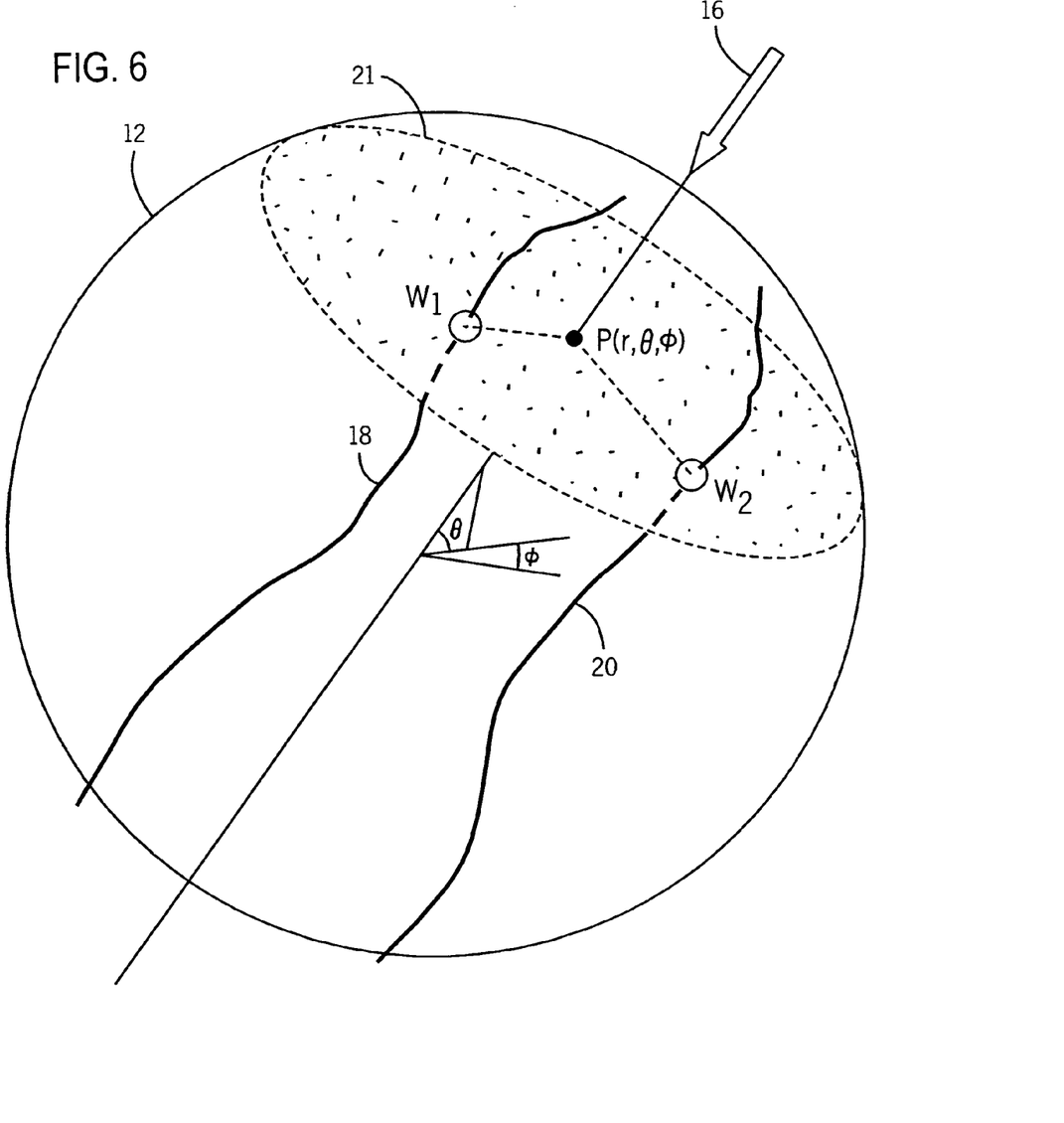
FIG. 6 is a pictorial representation of a 3D embodiment of the backprojection step according to the present invention.

A 3D embodiment of the invention is shown graphically in FIG. 6 for a single 3D projection view characterized by the view angles θ and φ. This projection view is fourier transformed to form a signal contour and it is back projected along axis 16 and spread into a Radon plane 21 at a distance r along the back projection axis 16. Instead of a filtered backprojection in which projection signal contour values are filtered and uniformly distributed into the successive Radon planes, along axis 16, the projection signal contour values are distributed in the Radon plane 21 using the information in the composite image. The composite image in FIG. 6 contains vessels 18 and 20. The weighted signal contour value is deposited at image location x,y,z in the Radon plane 21 based on the intensity at the corresponding location x,y,z in the composite image. This is a simple multiplication of the signal profile value by the corresponding composite image voxel value. This product is then normalized by dividing the product by the profile value from the corresponding image space profile formed from the composite image. The formula for the 3D reconstruction is $$I(x,y,z) = \Sigma(P(r,\theta,\phi) * C(x,y,z)_{(r,\theta,\phi)} / P_c(r,\theta,\phi)) \quad (2a)$$

where the sum ($\Sigma$) is over all projections in the image frame and the x,y,z values in a particular radon plane are calculated using the profile $P(r,\theta,\phi)$ at the appropriate $r,\theta,\phi$ value for that plane. $P_c(r,\theta,\phi)$ is the corresponding profile value from the composite image and $C(x,y,z)_{(r,\theta,\phi)}$ is the composite image value at $(r,\theta,\phi)$.

Another discovery of the present invention is that a priori information is available in an MR spectroscopy scan with which a composite image can be reconstructed and used to enhance the reconstruction of undersampled images. When a series of image frames are acquired in a scan, each image frame may be reconstructed using a very limited set of acquired views. However, each such set of views is interleaved with the views acquired for other image frames, and after a number of image frames have been acquired, a sufficient number of different views are available to reconstruct a quality composite image for use according to the present invention. The improved signal-to-noise ratio (SNR) of the composite image is transferred to each image frame by the highly constrained backprojection method.

DETAILED DESCRIPTION OF THE PREFERRED EMBODIMENT

Figure 1:
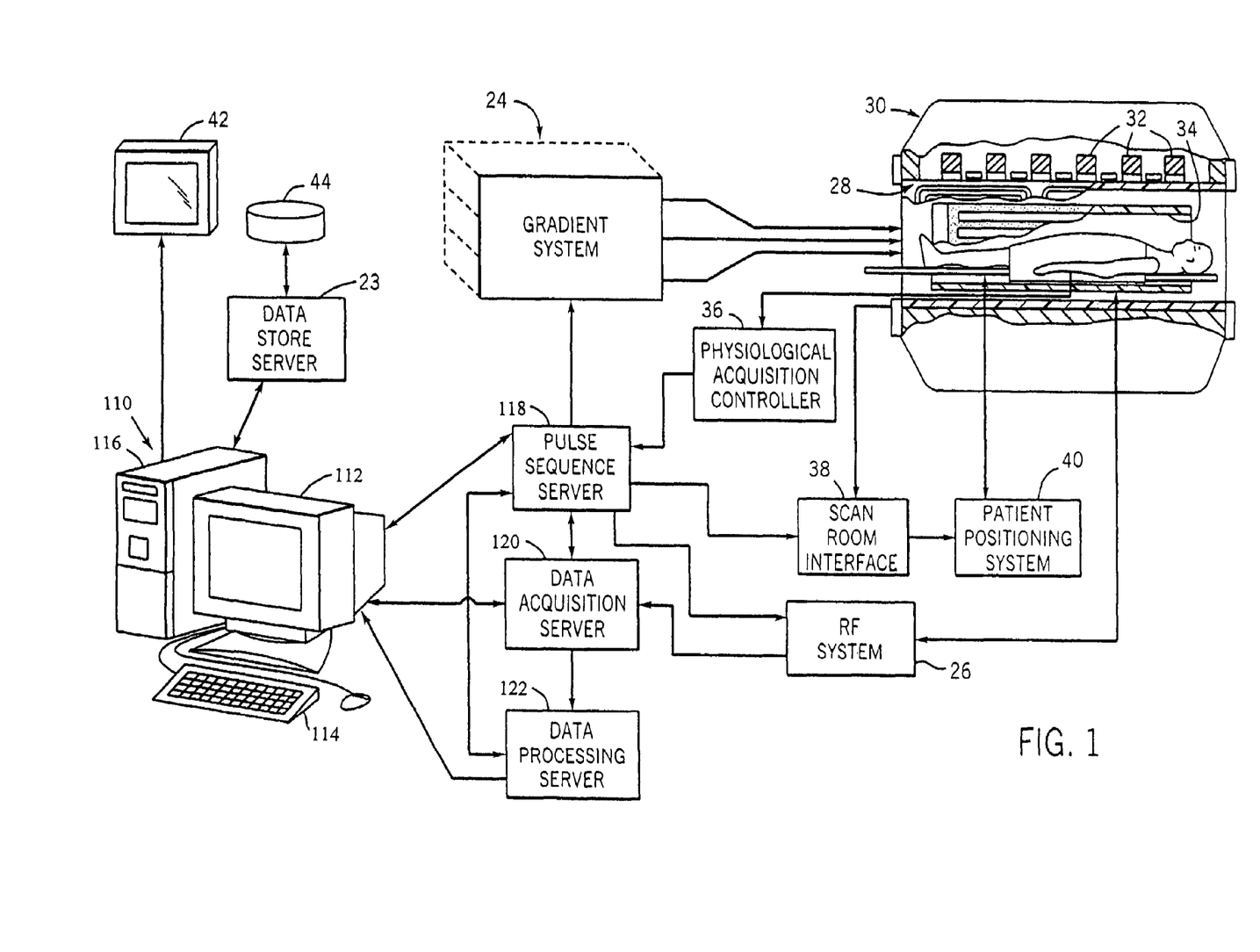
FIG. 1 is a block diagram of an MRI system which employs the present invention.

Referring particularly to FIG. 1, the preferred embodiment of the invention is employed in an MRI system. The MRI system includes a workstation 110 having a display 112 and a keyboard 114. The workstation 110 includes a processor 116 which is a commercially available programmable machine running a commercially available operating system. The workstation 10 provides the operator interface which enables scan prescriptions to be entered into the MRI system.

The workstation 110 is coupled to four servers: a pulse sequence server 118; a data acquisition server 120; a data processing server 122, and a data store server 23. In the preferred embodiment the data store server 23 is performed by the workstation processor 116 and associated disc drive interface circuitry. The remaining three servers 118, 120 and 122 are performed by separate processors mounted in a single enclosure and interconnected using a 64-bit backplane bus. The pulse sequence server 118 employs a commercially available microprocessor and a commercially available quad communication controller. The data acquisition server 120 and data processing server 122 both employ the same commercially available microprocessor and the data processing server 122 further includes one or more array processors based on commercially available parallel vector processors.

The workstation 10 and each processor for the servers 118, 120 and 122 are connected to a serial communications network. This serial network conveys data that is downloaded to the servers 118, 120 and 122 from the workstation 110 and it conveys tag data that is communicated between the servers and between the workstation and the servers. In addition, a high speed data link is provided between the data processing server 122 and the workstation 110 in order to convey image data to the data store server 23.

The pulse sequence server 118 functions in response to program elements downloaded from the workstation 110 to operate a gradient system 24 and an RF system 26. Gradient waveforms necessary to perform the prescribed scan are produced and applied to the gradient system 24 which excites gradient coils in an assembly 28 to produce the magnetic field gradients $G_x$, $G_y$, and $G_z$ used for position encoding NMR signals. The gradient coil assembly 28 forms part of a magnet assembly 30 which includes a polarizing magnet 32 and a whole-body RF coil 34.

RF excitation waveforms are applied to the RF coil 34 by the RF system 26 to perform the prescribed magnetic resonance pulse sequence. Responsive NMR signals detected by the RF coil 34 are received by the RF system 26, amplified, demodulated, filtered and digitized under direction of commands produced by the pulse sequence server 118. The RF system 26 includes an RF transmitter for producing a wide variety of RF pulses used in MR pulse sequences. The RF transmitter is responsive to the scan prescription and direction from the pulse sequence server 118 to produce RF pulses of the desired frequency, phase and pulse amplitude waveform. The generated RF pulses may be applied to the whole body RF coil 34 or to one or more local coils or coil arrays.

The RF system 26 also includes one or more RF receiver channels. Each RF receiver channel includes an RF amplifier that amplifies the NMR signal received by the coil to which it is connected and a quadrature detector which detects and digitizes the I and Q quadrature components of the received NMR signal. The magnitude of the received NMR signal may thus be determined at any sampled point by the square root of the sum of the squares of the I and Q components:

$$M=\sqrt{I^2+Q^2},$$

and the phase of the received NMR signal may also be determined:

$$\varphi=\tan^{-1} Q/I.$$

The pulse sequence server 118 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 118 to synchronize, or "gate", the performance of the scan with the subject's respiration or heart beat.

The pulse sequence server 118 also connects to a scan room interface circuit 38 which receives signals from various sensors associated with the condition of the patient and the magnet system. It is also through the scan room interface circuit 38 that a patient positioning system 40 receives commands to move the patient to desired positions during the scan.

It should be apparent that the pulse sequence server 118 performs real-time control of MRI system elements during a scan. As a result, it is necessary that its hardware elements be operated with program instructions that are executed in a timely manner by run-time programs. The description components for a scan prescription are downloaded from the workstation 110 in the form of objects. The pulse sequence server 118 contains programs which receive these objects and converts them to objects that are employed by the run-time programs.

The digitized NMR signal samples produced by the RF system 26 are received by the data acquisition server 120. The data acquisition server 120 operates in response to description components downloaded from the workstation 110 to receive the real-time NMR data and provide buffer storage such that no data is lost by data overrun. In some scans the data acquisition server 120 does little more than pass the acquired NMR data to the data processor server 122. However, in scans which require information derived from acquired NMR data to control the further performance of the scan, the data acquisition server 120 is programmed to produce such information and convey it to the pulse sequence server 118. For example, during prescans NMR data is acquired and used to calibrate the pulse sequence performed by the pulse sequence server 118. Also, navigator signals may be acquired during a scan and used to adjust RF or gradient system operating parameters or to control the view order in which k-space is sampled. And, the data acquisition server 120 may be employed to process NMR signals used to detect the arrival of contrast agent in an MRA scan. In all these examples the data acquisition server 120 acquires NMR data and processes it in real-time to produce information which is used to control the scan.

The data processing server 122 receives NMR data from the data acquisition server 120 and processes it in accordance with description components downloaded from the workstation 110. Such processing may include, for example: Fourier transformation of raw k-space NMR data to produce two or three-dimensional images; the application of filters to a reconstructed image; the performance of a backprojection image reconstruction of acquired NMR data; the calculation of functional MR images; the calculation of motion or flow images, etc.

Images reconstructed by the data processing server 122 are conveyed back to the workstation 110 where they are stored. Real-time images are stored in a data base memory cache (not shown) from which they may be output to operator display 112 or a display 42 which is located near the magnet assembly 30 for use by attending physicians. Batch mode images or selected real time images are stored in a host database on disc storage 44. When such images have been reconstructed and transferred to storage, the data processing server 122 notifies the data store server 23 on the workstation 110. The workstation 110 may be used by an operator to archive the images, produce films, or send the images via a network to other facilities.

Figure 7:
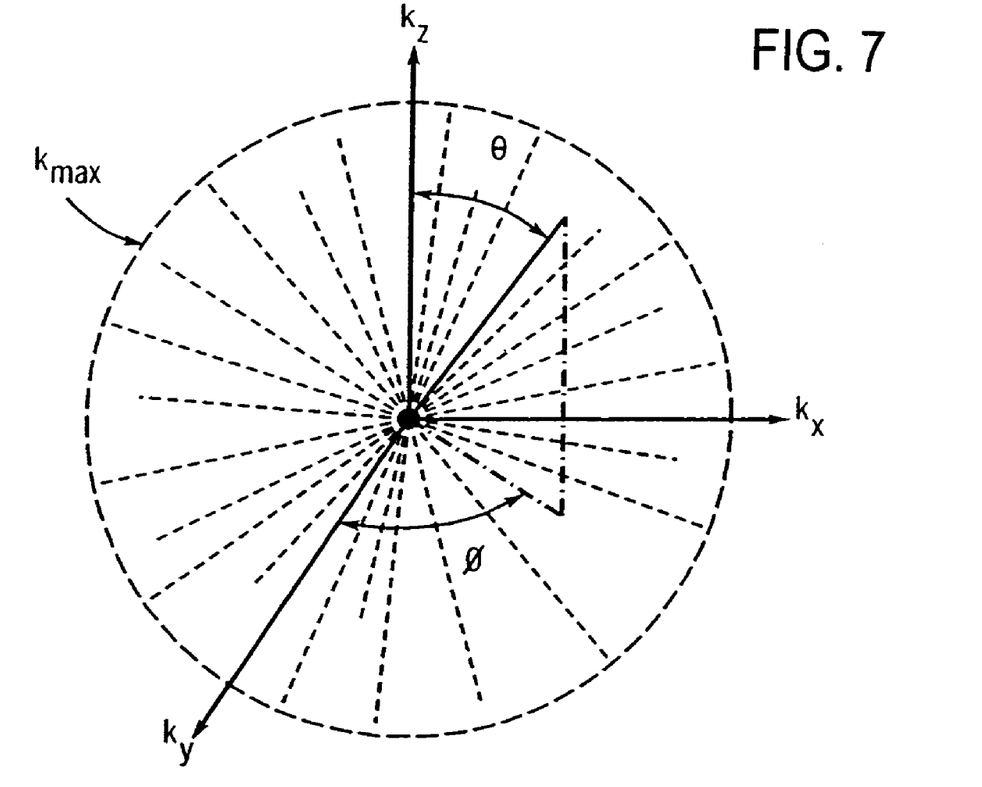
FIG. 7 is a graphic illustration of the angles that define scan parameters relative to a three-dimensional (3D) projection within an acquisition.

To practice a preferred embodiment of the invention MRS data is acquired in a 3D spherical k-space coordinate system, with the readout gradient direction defined by the angle θ from the $k_z$-axis and by the angle φ from the $k_y$-axis, as shown in FIG. 7. The sampling method consists of a series of evenly spaced projections with all projections going through the center of k-space. The maximum k-space radius value ($k_{max}$) determines the resolution in all three spatial directions of the resulting image. The radial sample spacing ($\Delta k_r$) determines the diameter (D) of the full field of view (FOV) of the reconstructed image. The full FOV image may be reconstructed without artifacts if the Nyquist condition is met, $\Delta k_\theta$, $\Delta k_\phi \leq \Delta k_r$. If this condition is not satisfied, however, alias-free reconstruction still occurs within a reduced diameter (d) that is less than the full FOV (D). If it is assumed that the projections are acquired evenly spaced ($\Delta k_\theta = \Delta k_\phi = \Delta k_r$), then the surface area A at $k_{max}$ associated with a projection is $$A = \Delta k^2 = \frac{2\pi}{N_p} k_{max}^2 \qquad (3)$$

where $N_p$ is the number of acquired views, or projections. Equation (3) determines $\Delta k$, by which the diameter (d) of the reduced FOV due to the angular spacing can be related to the full FOV diameter D as follows:

$$\frac{d}{D} = \frac{2}{N_R} \sqrt{\frac{N_p}{2\pi}}$$

where $N_R$ is the matrix size (i.e. number of k-space samples during the signal readout) across the FOV. In the image domain, a well-constructed reduced FOV appears centered around each object even if the Nyquist condition is not met. However, radial streak artifacts from outside can enter the local FOV due to the undersampling at the periphery of k-space. The condition that k-space be fully sampled, or d=D, requires that the number of sampled projections be:

$$N_p = \frac{\pi}{2} N_R^2. \qquad (4)$$

If $N_R$=256 samples are acquired during the readout of each acquired NMR signal, for example, the number of projections $N_p$ required to fully meet the Nyquist condition is around 103,000.

Figure 8:
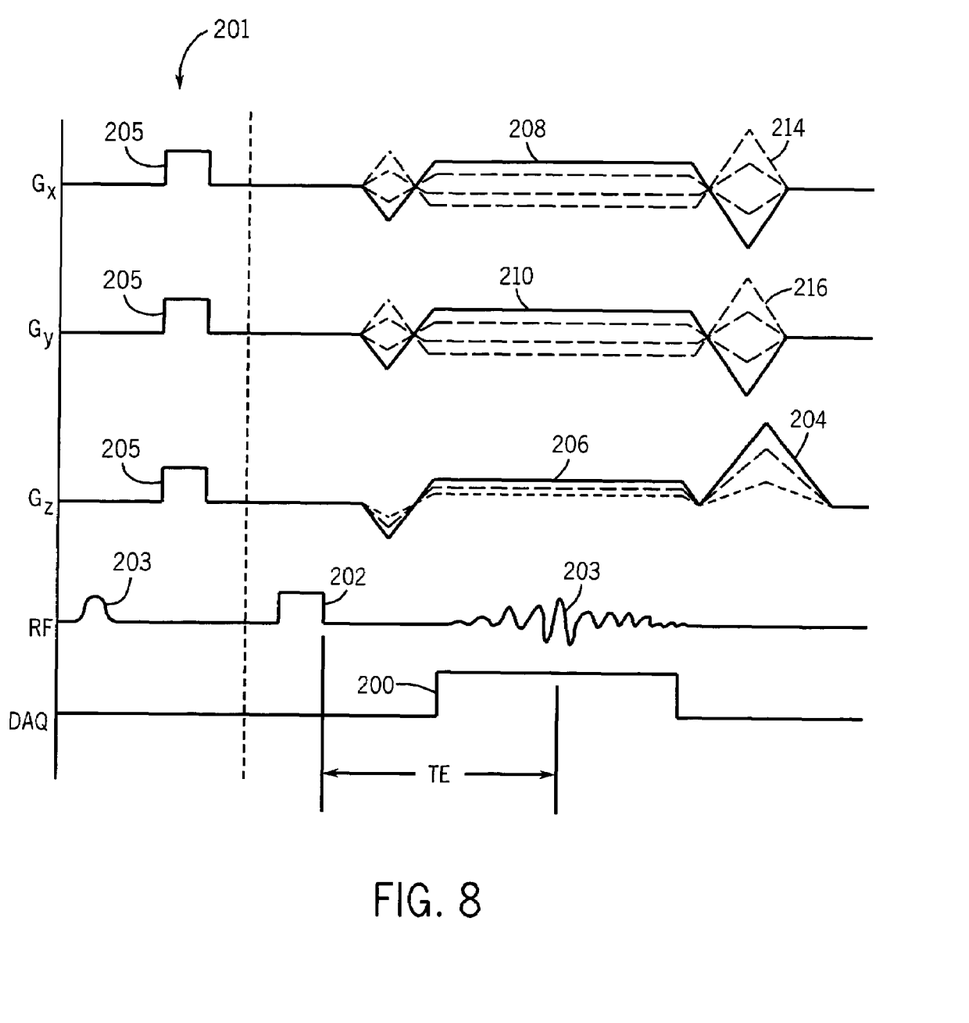
FIG. 8 is a graphic illustration of a preferred pulse sequence for directing the MRI system of FIG. 1 to acquire a 3D projection reconstruction image.

A pulse sequence used to acquire MRS data as 3D projections is shown in FIG. 8. The sequence is implemented on the above described MRI system equipped with a high-performance gradient subsystem (40 mT/m maximum amplitude and 150 T/m/sec maximum slew rate). Either full-echo or partial-echo readouts can be performed during a data acquisition window 200. If partial echo is chosen, the bottom half of k-space ($k_z<0$) is only partially acquired.

Undesired signal contributions of high magnitude, such as water in proton spectroscopy can be suppressed by a preparatory pulse sequence indicated generally at 201. This preparatory pulse sequence includes an rf excitation pulse 203 which is chemically selective to e.g. the water frequency and a set of spoiler gradients 205 directed along each gradient axis. The water selective rf pulse 203 tips the water magnetization 90° into the transverse plane and the gradients 205 dephase this transverse magnetization so that water does not produce a significant NMR signal in the subsequent imaging pulse sequence. As a result of the suppressed water signal, a sparse data set is produced that contains the metabolite signals of interest. Such a sparse data set is particularly compatible with the present method. Other signal suppression techniques directed at other spin species or metabolites that produce peaks in the acquired NMR signal may also be employed.

A gradient-recalled NMR echo signal 203 is produced by spins in the excited FOV and acquired in the presence of three readout gradients 206, 208 and 210. Because of the large FOV in all directions, a non-selective radio-frequency (RF) pulse 202 can be used to produce transverse magnetization throughout the image FOV. Since a slab-select gradient is not required, the readout gradient waveforms $G_x$, $G_y$, and $G_z$ have a similar form. This symmetry is interrupted only by the need to spoil the sequence, which is accomplished by playing a dephasing gradient lobe 204. The $G_x$ and $G_y$ readout gradients 208 and 210 are rewound by respective gradient pulses 214 and 216 to achieve steady state.

The readout gradient waveforms $G_x$, $G_y$ and $G_z$ are modulated during the scan to sample radial trajectories at different angles. The angular spacing is chosen such that a uniform distribution of k-space sample points occurs at the peripheral boundary ($k_{max}$) of the sampled k-space sphere. Although several methods of calculating the distribution are known, a method which evenly distributes the projections by sampling the spherical surface with a spiral trajectory, with the conditions of constant path velocity and surface area coverage is used. This solution also has the benefit of generating a continuous sample path, which reduces gradient switching and eddy currents. For N total projections, the equations for the gradient amplitude as a function of projection number n are:

$$G_z = \frac{2n-1}{2N} \quad (5)$$

$$G_x = \cos(\sqrt{2N\pi}\sin^{-1}G_z(n))\sqrt{1-G_z(n)^2} \quad (6)$$

$$G_y = \cos(\sqrt{2N\pi}\sin^{-1}G_z(n))\sqrt{1-G_z(n)^2}. \quad (7)$$

If a fully sampled image acquisition is to be performed, N is set to $N_p$ as defined above in equation (4) and a series of N=N pulse sequences are performed. The readout gradient amplitudes for the $n^{th}$ pulse sequence in this series is given by equations (5), (6) and (7). While n can be indexed from 1 to N in monotonic order during the scan, it can be appreciated that other sampling orders are also possible.

It should be apparent to those skilled in the art that sampling trajectories other than the preferred straight line trajectory extending from one point on the k-space peripheral boundary, through the center of k-space to an opposite point on the k-space peripheral boundary may be used. As mentioned above, one variation is to acquire a partial NMR echo signal 203 which samples along a trajectory that does not extend across the entire extent of the sampled k-space volume. Another variation which is equivalent to the straight line projection reconstruction pulse sequence is to sample along a curved path rather than a straight line. Such pulse sequences are described, for example, in "Fast Three Dimensional Sodium Imaging", MRM, 37:706-715, 1997 by F. E. Boada, et al. and in "Rapid 3D PC-MRA Using Spiral Projection Imaging", Proc. Intl. Soc. Magn. Reson. Med. 13 (2005) by K. V. Koladia et al and "Spiral Projection Imaging: a new fast 3D trajectory", Proc. Intl. Soc. Mag. Reson. Med. 13 (2005) by J. G. Pipe and Koladia. It should also be apparent that the present invention may be employed with 2D as well as 3D versions of these sampling methods and references herein to the term "pixel" is intended to refer to a location in either a 2D or a 3D image.

Figure 9:
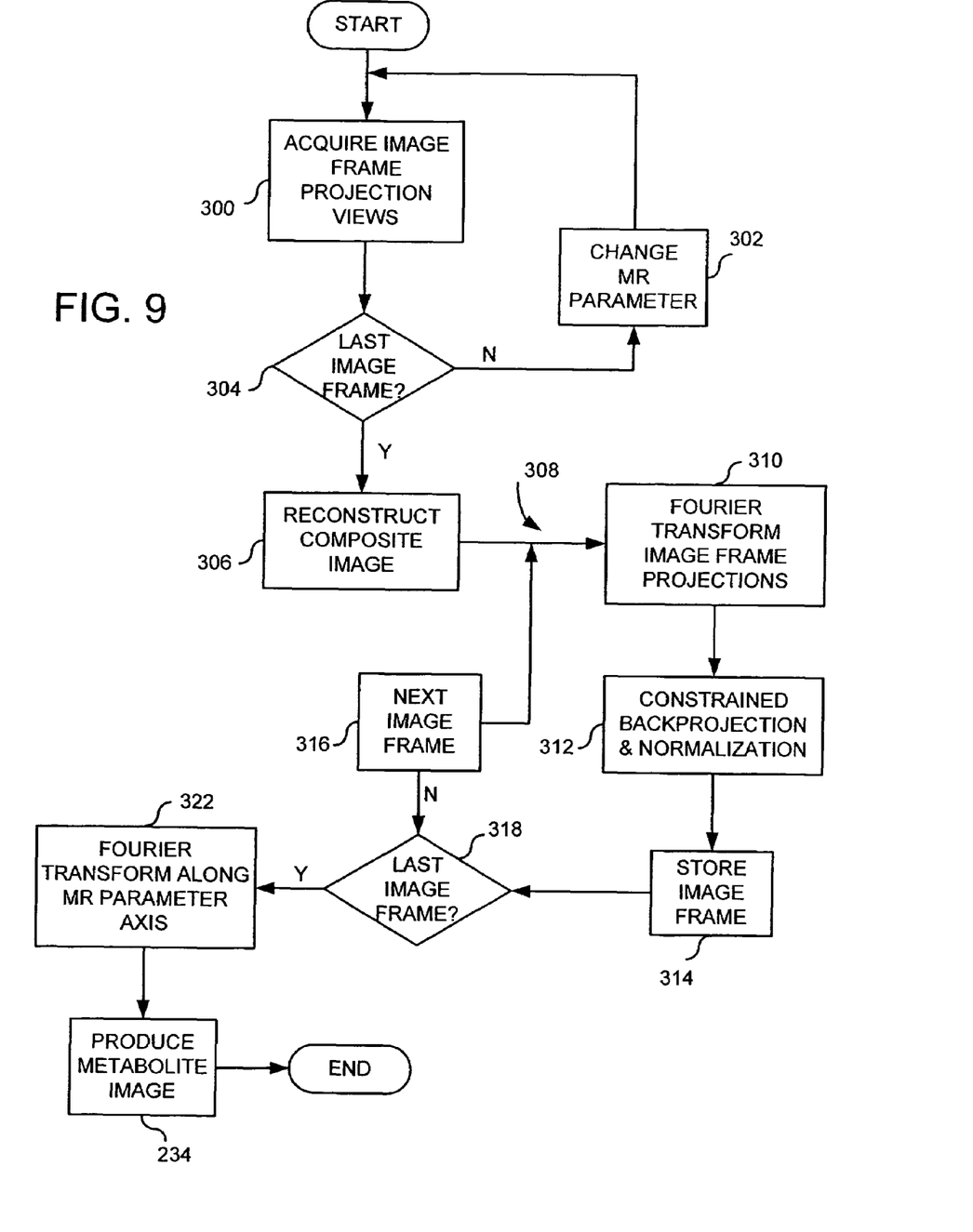
FIG. 9 is a flow chart illustrating steps in the preferred embodiment of the invention.

The first preferred embodiment of the invention uses the above 3DPR pulse sequence to acquire a series of image frames with the MRI system from which a metabolite image is constructed. Referring specifically to FIG. 9, the echo time (TE) in the above-described pulse sequence is set to an initial value and a set of projection views are acquired of the subject in the MRI system as indicated at process block 300. A highly undersampled k-space data set is formed with these projections which are spaced substantially equally from each other to sample k-space as uniformly as possible. For example, a 3D image frame may have only 200 acquired projection views.

Additional k-space data sets are acquired in the same manner after changing the echo time (TE) in the pulse sequence as indicated at process block 302. From 500 to 1000 image frames are acquired in this manner with progressively longer echo times (TE), and 200 projection views are acquired for each image frame k-space data set. The projection angles on all of these acquired projection views are interleaved with respect to each other such that at the end of the scan as determined at decision block 304 k-space is highly sampled by the combined acquisitions.

As indicated at process block 306, the next step is to reconstruct a composite image using the combined projection views from all the acquired image frames. This is a conventional image reconstruction and in the preferred embodiment it is performed by regridding the combined 3D k-space projection data set to form a 3D Cartesian k-space data set. The composite image is produced by performing an inverse 3D Fourier transformation on the regridded k-space data set. Because all the interleaved projection views that were acquired during the scan are employed in this image reconstruction, the composite image has a high SNR and minimal streak artifacts.

A loop is then entered as indicated generally at 308 in which each image frame k-space data set is employed along with the composite image to reconstruct a series of image frames. As indicated by process block 310, the first step is to transform the frame image k-space projections to Radon space by Fourier transforming them. The result is a set of signal profiles 10 as depicted in FIG. 5. As indicated at process block 312, each of these signal profiles is then backprojected into the VOA as depicted by path 8 in FIG. 5. This backprojection is weighted by the composite image and normalized as described above with reference to equation (2a). This is repeated for each projection view in the image frame and the results of each highly constrained backprojection are summed to form an image frame that is stored as indicated at process block 314.

Figure 10:
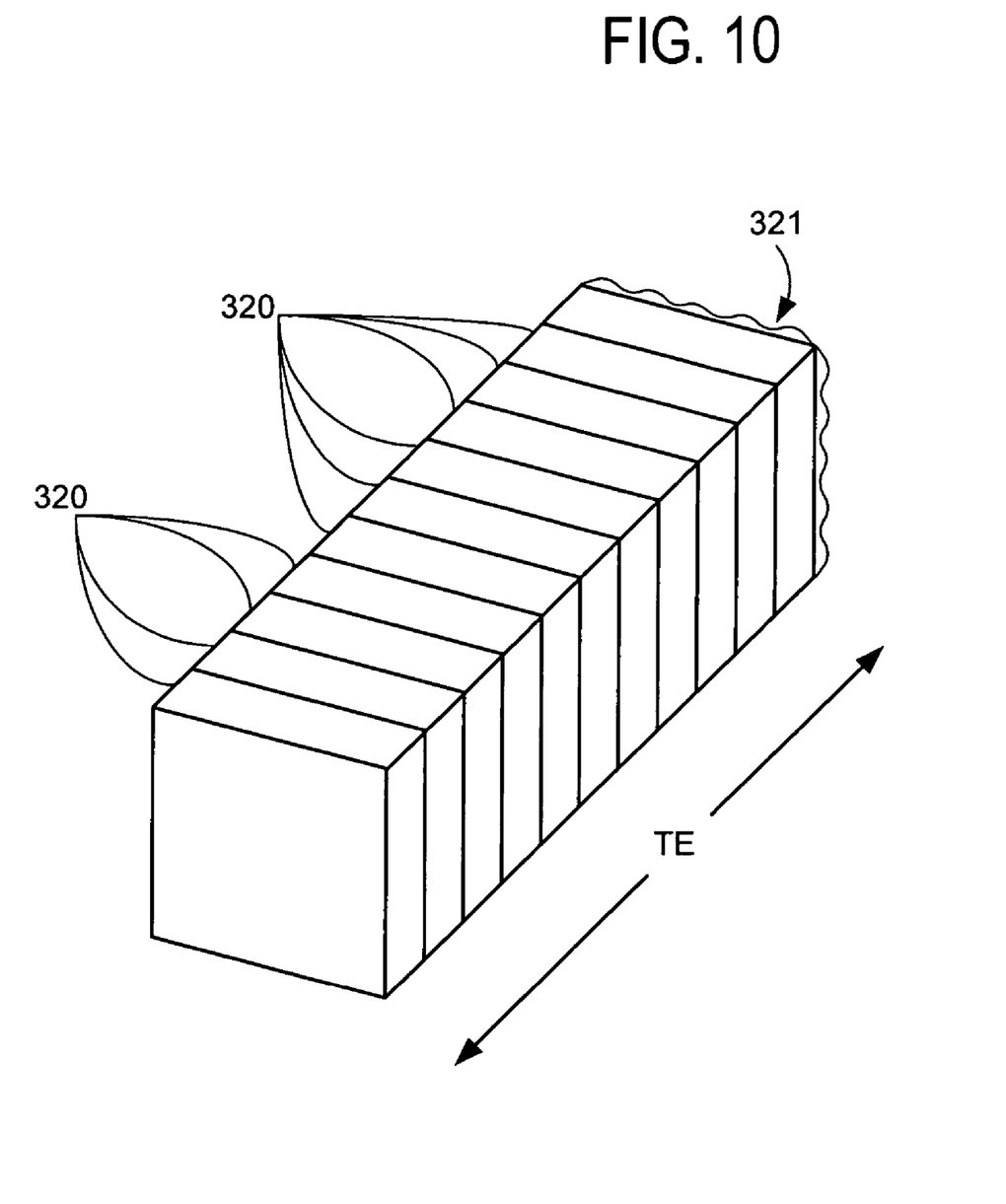
FIG. 10 is a pictorial representation of image data produced using the method of FIG. 9.

This process 308 repeats as indicated by process block 316 until all of the acquired image frames are reconstructed as determined at decision block 318. As illustrated in FIG. 10, a series of three dimensional image frames 320 are thus reconstructed and may be organized as a spectroscopy data set 321 disposed along an echo time axis TE. Each corresponding pixel in the image frames 320 thus represents the NMR signal magnitude at an x,y,z location in the patient at successive echo times (TE) and a Fourier transformation along this TE axis as indicated by process block 322 produces a spectrum for that location. This spectrum is examined to locate the value corresponding to a particular metabolite of interest, and this value is used to modulate the brightness of a corresponding pixel x,y,z in a metabolite image as indicated at process block 324.

The above procedure can also be used to image metabolites with procedures that are designed for specific metabolites and require fewer parameter samplings to produce the desired spectral resolution. For example, a method such as that described in U.S. Pat. Pub. 2005/0085713A1 published on Apr. 21, 2005 may be used to image specific metabolites where the peak frequency for each metabolite is known. A plurality of images of the subject are acquired with a corresponding plurality of different echo times TE. The number of different echo times TE corresponds to the number of metabolite peak frequencies and these separate image frames can be acquired with interleaved projection views according to the present invention. A composite image is reconstructed with the combined acquired data and this composite image is then used to reconstruct each image frame as described above. The displayed spectral peaks in this embodiment of the invention does not require a Fourier transformation along the TE axis as described above.

It should be apparent to those skilled in this art that the present invention is applicable to many other MR spectroscopy measurements. Whereas the echo time (TE) is the MR parameter that is changed in the above-described preferred embodiment to produce a given metabolite image, other MR parameters may also be changed as each set of image frame projection views is acquired.

It should also be apparent that the present invention is applicable to MR procedures other than spectroscopy. For example, a series of image frames may be acquired to produce a $T_2$ image of the subject. In this particular application each image frame is acquired at a different echo time (TE) as described above, but instead of Fourier transforming the resulting pixel values in the data set 321, successive pixel values at a location x,y,z are fit to a $T_2$ relaxation decay curve. The $T_2$ relaxation time can therefore be calculated at each pixel location x,y,z and a $T_2$ image may be displayed from the result.

Other MR parameters may also be changed. In diffusion weighted imaging (DWI) a motion encoding gradient is included in the pulse sequence and a number of images are acquired with the motion encoding gradient being the MR parameter that is changed in direction or magnitude. The present invention enables these images to be acquired in less scan time without the loss in image quality. Similarly, a series of MR images may be acquired in which the flip angle of an RF excitation pulse is the MR parameter that is changed to produce a series of image frames of the subject.

The present invention may also be used to produce scatter plots to help separate voxels having various characteristics. One axis of the scatter plot indicates one MR parameter value and its other axis indicates a second MR parameter. Each MR parameter value is measured by a series of image frames acquired with interleaved projections and reconstructed with a composite image reconstructed from all the interleaved projection views. For example, one measured parameter may be the $T_2$ constant measured with a series of image frames of differing echo times TE, and the other parameter may be spin velocity measured with one or more image frames with a velocity encoding gradient along one or more axes. The resulting velocity and $T_2$ values computed at each image pixel x,y,z may be used to segment tissues such as moving blood from stationary tissues and venous blood from arterial blood.

The invention claimed is:

1. A method for producing an image of a subject positioned in the field of view (FOV) of a magnetic resonance imaging (MRI) system, the steps comprising:
   a) acquiring with the MRI system a set of projection views of the subject using a pulse sequence having a set of MR parameters;
   b) changing an MR parameter in the pulse sequence and repeating step a) to acquire an additional set of projection views, wherein the acquired projection views are interleaved;
   c) reconstructing a composite image that indicates a value at each composite image pixel using projection views from a plurality of said sets of projection views;
   d) reconstructing image frames from corresponding sets of projection views, each image frame being reconstructed by:
      d)i) backprojecting each projection view in the corresponding set of projection views and weighting the value backprojected into each image frame pixel by the value of the corresponding pixel in the composite image; and
      d)ii) summing the backprojected values for each image frame pixel; and
   e) processing the reconstructed image frames to produce an image.

2. The method as recited in claim 1 in which step b) is repeated a plurality of times.

3. The method as recited in claim 2 in which step e) includes Fourier transforming the signal values at corresponding pixel locations in the plurality of reconstructed image frames.

4. The method as recited in claim 1 in which the MR parameter is the echo time (TE) of the pulse sequence.

5. The method as recited in claim 4 in which step e) includes producing a $T_2$ image by fitting a $T_2$ relaxation decay curve to the signal values at corresponding pixel locations in the plurality of reconstructed image frames.

6. The method as recited in claim 1 in which the image produced in step e) depicts a metabolite in the subject.

7. The method as recited in claim 6 in which the pulse sequence includes a preparatory pulse sequence which suppresses the NMR signals from spins not associated with the metabolite.

8. The method as recited in claim 7 in which the suppressed NMR signals are from spins associated with water.

9. The method as recited in claim 1 in which the pulse sequence includes pulses that selectively suppress the NMR signals from selected spins.

10. The method as recited in claim 1 in which step b) is repeated a plurality of times and one of a first MR parameter and a second MR parameter is changed for each repetition.

11. The method as recited in claim 10 in which step e) includes:
   e)i) producing a first image from image frames reconstructed from sets of projection views in which the first MR parameter is changed; and
   e)ii) producing a second image from image frames reconstructed from sets of projection views in which the second MR parameter is changed.

* * * * *